(12) United States Patent
Lin et al.

(10) Patent No.: US 8,735,933 B2
(45) Date of Patent: May 27, 2014

(54) LIGHT EMITTING DIODE PACKAGE AND METHOD OF MANUFACTURING THE SAME

(75) Inventors: Hsin-Chiang Lin, Hsinchu (TW); Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/370,316

(22) Filed: Feb. 10, 2012

(65) Prior Publication Data

US 2013/0015479 A1 Jan. 17, 2013

(30) Foreign Application Priority Data

Jul. 15, 2011 (CN) .......................... 2011 1 0198474

(51) Int. Cl.
*H01L 33/00* (2010.01)

(52) U.S. Cl.
USPC ........ 257/99; 257/98; 257/100; 257/E33.056; 257/E33.067; 438/26; 438/27

(58) Field of Classification Search
USPC .................................................. 257/79–100
See application file for complete search history.

(56) References Cited

U.S. PATENT DOCUMENTS

| 8,067,782 | B2 * | 11/2011 | Chang et al. ..................... 257/99 |
| 2006/0231852 | A1 * | 10/2006 | Kususe et al. ................... 257/99 |
| 2009/0250709 | A1 | 10/2009 | Chang |
| 2011/0062474 | A1 * | 3/2011 | Chen et al. ....................... 257/98 |
| 2011/0104856 | A1 * | 5/2011 | Lin et al. ....................... 438/118 |
| 2013/0026529 | A1 * | 1/2013 | Tsang ............................. 257/99 |

* cited by examiner

*Primary Examiner* — Matthew W Such
*Assistant Examiner* — Frederick B Hargrove
(74) *Attorney, Agent, or Firm* — Novak Druce Connolly Bove + Quigg LLP

(57) ABSTRACT

An LED package includes a base, an LED chip, and an electrode layer. The base has thereon a first electrical connecting layer and a separated second electrical connecting layer. The LED chip is placed on the base and electrically connected with the first electrical connecting layer and the second electrical connecting layer by flip chip bonding. The electrode layer comprises a first electrode and a separated second electrode, and a receiving groove being defined between the first electrode and the second electrode. The base is received in the receiving groove of the electrode layer with the first electrical connecting layer being electrically connected to the first electrode, and the second electrical connecting layer being electrically connected to the second electrode.

4 Claims, 11 Drawing Sheets

LIGHT EMITTING DIODE PACKAGE AND METHOD OF MANUFACTURING THE SAME

BACKGROUND

1. Technical Field

The present disclosure relates generally to light emitting devices, and more particularly to a light emitting diode package and a method of manufacturing the same.

2. Description of Related Art

Light emitting diodes (LEDs) are solid state light emitting devices formed of semiconductors, which are more stable and reliable than other conventional light sources such as incandescent bulbs. Thus, LEDs are being widely used in various fields such as numeral/character displaying elements, signal lights, light sources for lighting and display devices. When in use, providing LEDs in packages can provide protection, color selection, focusing and the like for light emitted by the LEDs.

A typical LED package includes a base, an LED chip, and an encapsulating layer. The LED chip is electrically connected to electrical structures on the base via gold wires. The encapsulating layer encapsulates the LED chip. Generally, in the process of encapsulating, the encapsulating layer covers the LED chip by a technique of molding. However, the LED chip and gold wires are prone to damage during the process of molding. Thus, a reliability of the LED chip and electrical connection between the LED chip and the gold wires is impaired. Moreover, the manufacturing process for the conventional LED package is complex, and the production cost thereof is high.

What is needed therefore is a light emitting diode package and a method of packaging a light emitting device which can overcome the above mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

Reference will now be made to the drawings to describe the present LED package and method for manufacturing the same in detail.

Figure 1:
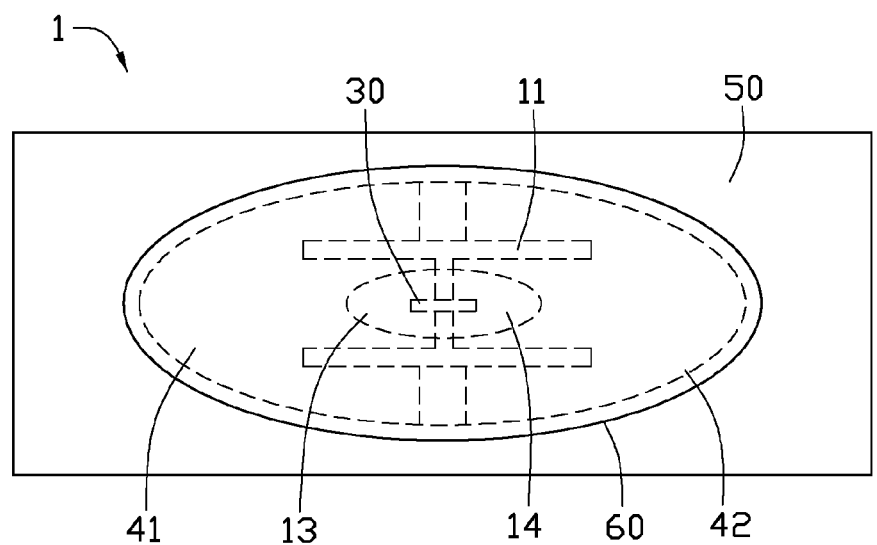
FIG. 1 is schematic, top view of an LED package in accordance with an embodiment of the present disclosure.
Figure 2:
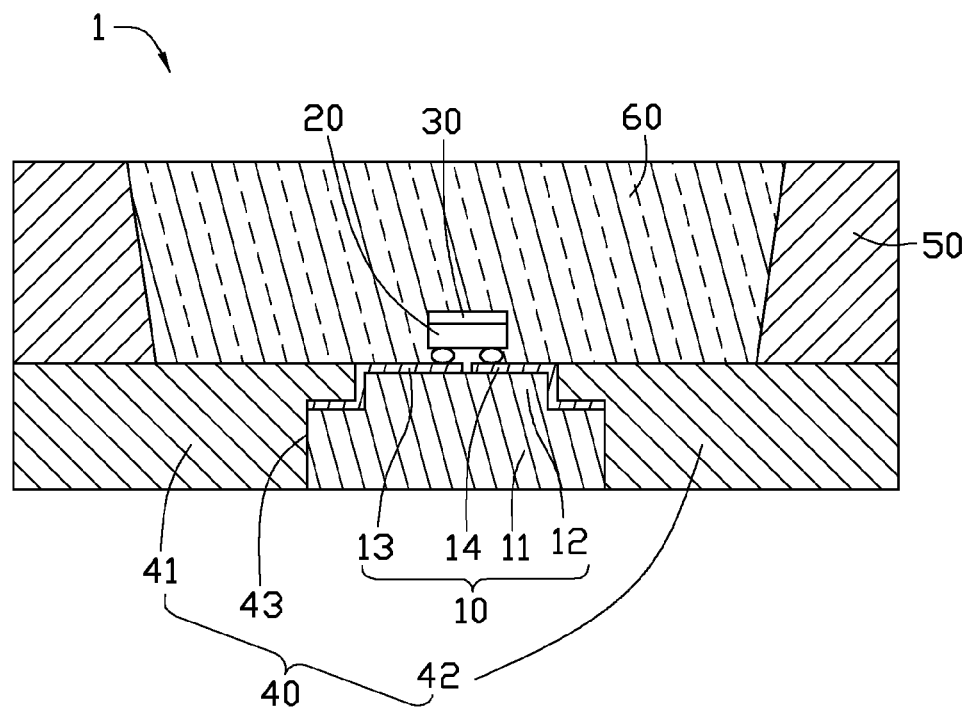
FIG. 2 is a cross-sectional view of the LED package of FIG. 1.

Referring to FIGS. 1 and 2, an LED package in accordance with an embodiment of the present disclosure is illustrated. The LED package 1 comprises a base 10, an LED chip 20 placed on and electrically connected with the base 10, an electrode layer 40 electrically connected to the base 10, a reflection cup 50 placed on the electrode layer 40, and an encapsulation 60 placed on the base 10 and the electrode layer 40, surrounded by the reflection cup 50 and covering the LED chip 20.

The base 10 includes a substrate 11, a holding portion 12 extending upwardly from the middle of the substrate 11, a first electrical connecting layer 13, and a second electrical connecting layer 14. The first electrical connecting layer 13 and the second electrical connecting layer 14 are both located on a top of the holding portion 12 and extended to a top of the substrate 11 and separated from each other. That is, the first electrical connecting layer 13 and the second electrical connecting layer 14 are electrically insulated from each other. In the present embodiment, the substrate 11 is flat, the holding portion 12 is an ellipse cylinder profile extending upwardly from the middle of the substrate 11 perpendicularly, and the first electrical connecting layer 13 and the second electrical connecting layer 14 both extend from the top of the holding portion 12 to the top of the substrate 11 through a side wall (not labeled) of the holding portion 12.

The LED chip 20 is placed on the top of the holding portion 12 and electrically connected with the first electrical connecting layer 13 and the second electrical connecting layer 14. In the present embodiment, the LED chip 20 is electrically connected with the first electrical connecting layer 13 and the second electrical connecting layer 14 by flip chip bonding, such that the LED chip 20 can be directly attached onto the first electrical connecting layer 13 and the second electrical connecting layer 14 and achieving electrical connection without wire bonding. Particularly, the LED chip 20 is flipped over so that its top side faces down, and aligned so that its pads (not shown) align with matching the first electrical connecting layer 13 and the second electrical connecting layer 14 on the holding portion 12, and then the solder (not labeled) is flowed to complete the interconnect. Therefore, the manufacturing process for the LED package 1 is simple, and with low production cost. Furthermore, because the LED chip 20 directly contacts the first electrical connecting layer 13 and the second electrical connecting layer 14, heat from the LED chip 20 is effectively dissipated by the first electrical connecting layer 13 and the second electrical connecting layer 14 and the base 10, whereby heat-dissipation efficiency of the LED package 1 is optimized. In addition, a phosphor layer 30 can be formed on the top of the LED chip 20 to gain white light or a desired color light.

The electrode layer 40 comprises a first electrode 41 and a separated second electrode 42. The first electrode 41 and the second electrode 42 are respectively electrically connected with the first electrical connecting layer 13 and the second electrical connecting layer 14. The electrode layer 40 further defines a receiving groove 43 between the first electrode 41 and the second electrode 42. The base 10 is fittingly received in the receiving groove 43 of the electrode layer 40. A top of the first electrode 41 is coplanar with a top of the part of the first electrical connecting layer 13 extending on the top of the holding portion 12, a top of the second electrode 42 and a top of the part of the second electrical connecting layer 14 extending on the top of the holding portion 12.

The reflection cup 50 is located on the electrode layer 40 to surround the LED chip 20. The encapsulation 60 is filled in the reflection cup 50 to cover the LED chip 20 by glue-dispensing process.

Figure 3:
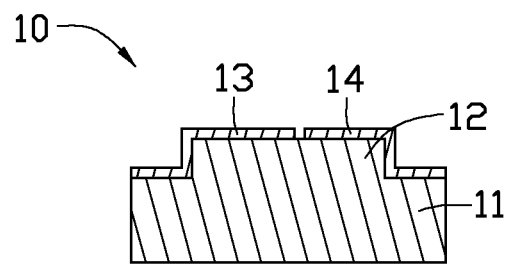
FIGS. 3-11 are schematic, cross-sectional views illustrating steps of a method for manufacturing the LED package in FIG. 1.
Figure 4:
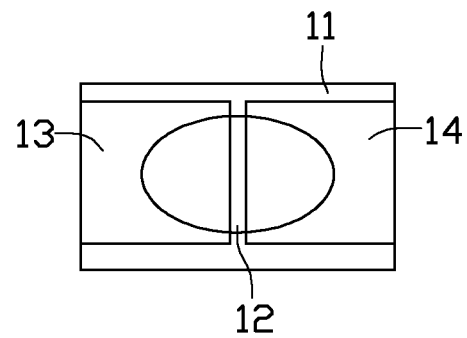

Referring to FIGS. 3-11, the present disclosure provides a method for manufacturing the LED chip 20 which comprises the following steps:

As shown in FIGS. 3-4, a base 10 is provided. The base 10 includes a substrate 11, a holding portion 12 extending upwardly from the middle of the substrate 11, a first electrical connecting layer 13, and a second electrical connecting layer 14. The substrate 11 and the holding portion 12 are made of ceramic, silicon, or other electrically insulating materials with high heat conducting efficiency. The first electrical connecting layer 13 and the second electrical connecting layer 14 are both located on a top of the holding portion 12 and extended to a top of the substrate 11 and separated from each other. In the present embodiment, the substrate 11 is flat, the holding portion 12 has an ellipse cylinder profile extending upwardly from the middle of the substrate 11 perpendicularly, and the first electrical connecting layer 13 and the second electrical connecting layer 14 both extend from the top of the substrate 11 to the top of the holding portion 12 through a side wall (not labeled) of the holding portion 12.

Figure 5:
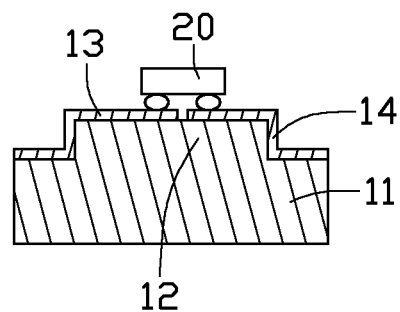

As shown in FIG. 5, an LED chip 20 is mounted on the top of the holding portion 12 and electrically connected with the first electrical connecting layer 13 and the second electrical connecting layer 14 by flip chip bonding.

Figure 6:
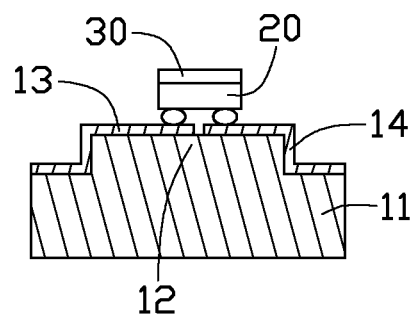

As shown in FIG. 6, a phosphor layer 30 is formed on the top of the LED chip 20.

Figure 7:
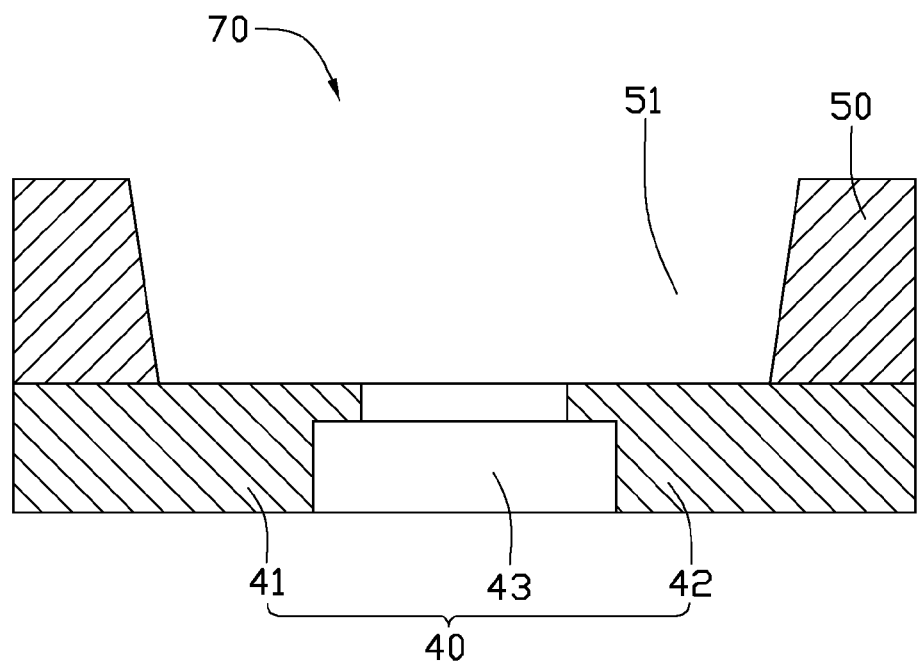
Figure 8:
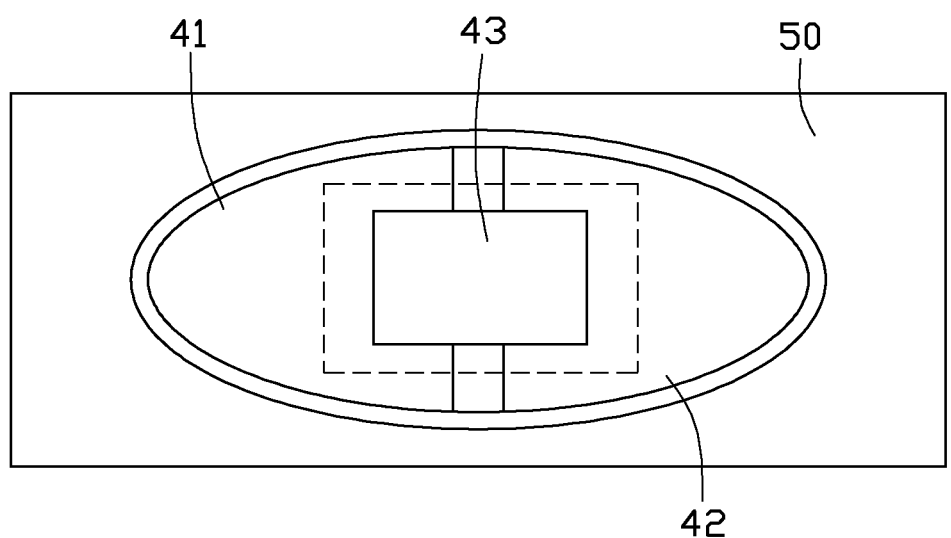

As shown in FIGS. 7 and 8, a main body 70 is provided. The main body 70 comprises an electrode layer 40 and a reflection cup 50 formed on the electrode layer 40. The electrode layer 40 comprises a first electrode 41, a separated second electrode 42, and a receiving groove 43 between the first electrode 41 and the second electrode 42. The receiving groove 43 of the electrode layer 40 is configured for fittingly receiving the base 10. The reflection cup 50 defines a space 51 communicating with the receiving groove 43.

Figure 9:
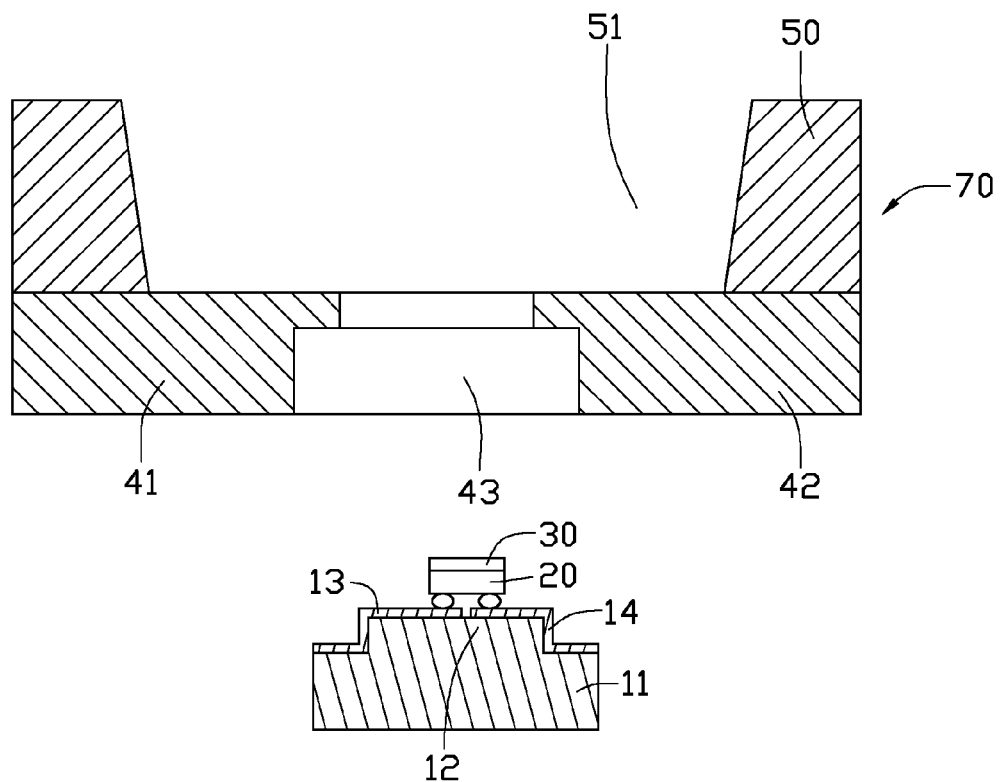
Figure 10:
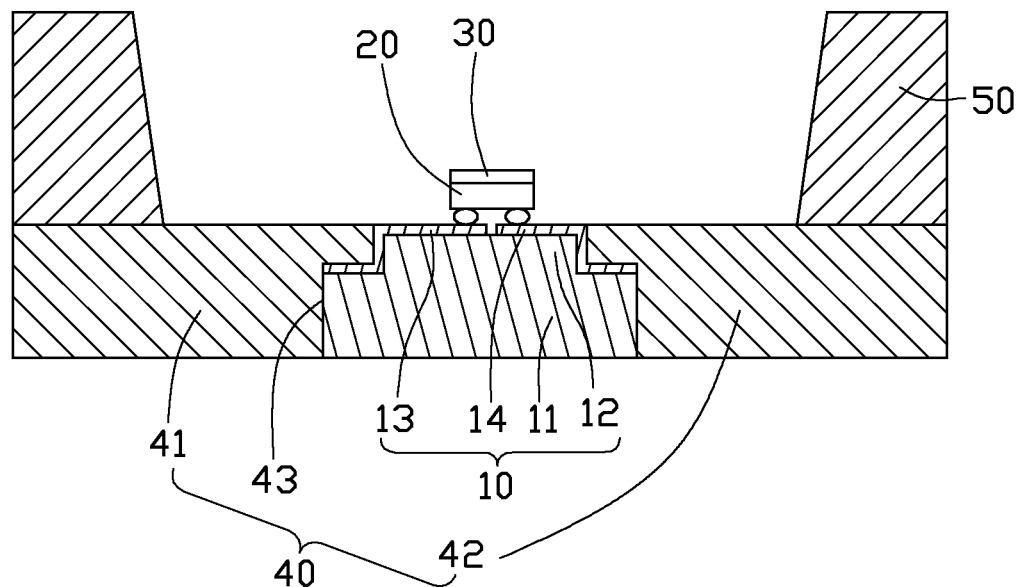

As shown in FIGS. 9 and 10, the base 10 is inserted in the receiving groove 43 of the electrode layer 40, and accordingly the first electrical connecting layer 13 is electrically connected to the first electrode 41, the second electrical connecting layer 14 is electrically connected to the second electrode 42, and the LED chip 20 located on the base 10 can be placed on bottom of the space 51 of the reflection cup 50. A top of the first electrode 41 is coplanar with a top of the part of the first electrical connecting layer 13 extending on the top of the holding portion 12, a top of the second electrode 42 and a top of the part of the second electrical connecting layer 14 extending on the top of the holding portion 12, such that the output light efficiency of the LED chip 20 can be improved, and a thickness of the whole LED package 1 is thinner than a conventional LED package.

Figure 11:
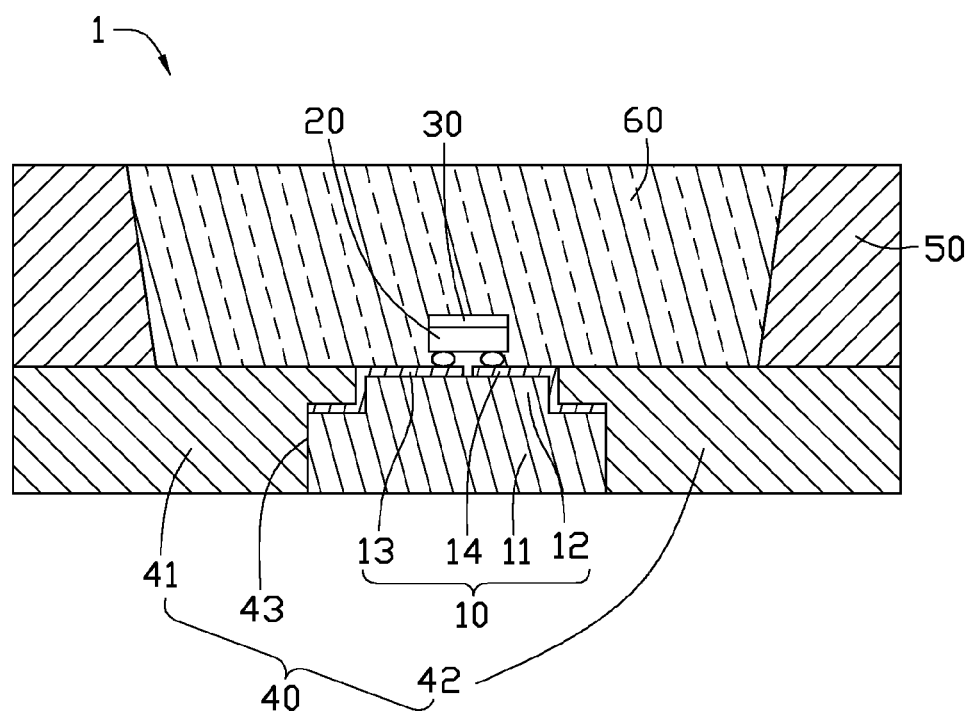

As shown in FIG. 11, an encapsulation 60 is filled in the space 51 of the reflection cup 50 to cover the LED chip 20 by glue-dispensing process.

It can be understood that, the LED chip 20 can be placed on the top of the holding portion 12 by flip chip bonding after the base 10 being inserted in the receiving groove 43 of the electrode layer 40.

As described above, the LED chip 20 is electrically connected with the first electrical connecting layer 13 and the second electrical connecting layer 14 by flip chip bonding, and the base 10 can be conveniently assembled onto the main body 70 to make the LED package 1 as shown in FIGS. 1 and 2. Therefore, the manufacturing process for the LED package 1 is simple, and with a low production cost.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A light emitting diode package comprising:
    a main body comprising an electrode layer consisted of a first electrode and a separated second electrode, a reflection cup formed on the electrode layer, and a receiving groove defined between the first electrode and the second electrode, a space surrounded by the reflection cup being communicated with the receiving groove;
    a base comprising a substrate, a holding portion extending upwardly from a middle of the substrate, a first electrical connecting layer, a separated second electrical connecting layer, and an LED chip placed on a top of the holding portion and electrically connected with the first electrical connecting layer and the second electrical connecting layer by flip chip bonding, the base being inserted in the receiving groove of the main body, the first electrical connecting layer being electrically connected to the first electrode, and the second electrical connecting layer being electrically connected to the second electrode;
    wherein a top of the first electrode is coplanar with a top of the part of the first electrical connecting layer extending on the top of the holding portion, a top of the second electrode is coplanar with a top of the part of the second electrical connecting layer extending on the top of the holding portion, a bottom of the first electrode and a bottom of the second electrode are both coplanar with a bottom of the base.

2. The light emitting diode package of claim 1, wherein the first electrical connecting layer and the second electrical connecting layer both extend from the top of the holding portion to a top of the substrate through a side wall of the holding portion.

3. The light emitting diode package of claim 1, further comprising an encapsulation filled in the reflection cup to cover the LED chip.

4. The light emitting diode package of claim 1, further comprising a phosphor layer formed on a top of the LED chip.

* * * * *